United States Patent
Martin, Jr. et al.

(10) Patent No.: US 6,787,695 B2
(45) Date of Patent: Sep. 7, 2004

(54) ERGONOMIC SHIELD FOR ASSEMBLY TO AND DISASSEMBLY FROM A SUBSTRATE

(75) Inventors: Daniel Martin, Jr., Hialeah, FL (US); Adrian Fernando Rubio, Coral Springs, FL (US); Christopher D. Crawford, Tamarac, FL (US)

(73) Assignee: Motorola, Inc, Schaumburg, IL (US)

( * ) Notice: Subject to any disclaimer, the term of this patent is extended or adjusted under 35 U.S.C. 154(b) by 113 days.

(21) Appl. No.: 10/179,069

(22) Filed: Jun. 25, 2002

(65) Prior Publication Data

US 2003/0234177 A1 Dec. 25, 2003

(51) Int. Cl.⁷ ................................................ H05K 9/00
(52) U.S. Cl. ...................... 174/35 R; 206/719; 206/724
(58) Field of Search .......................... 174/35 R, 35 GC; 361/799, 800, 816, 818; 206/701, 706, 719, 724

(56) References Cited

U.S. PATENT DOCUMENTS

| | | | | |
|---|---|---|---|---|
| 4,187,953 A | * | 2/1980 | Turner | 215/301 |
| 4,535,905 A | * | 8/1985 | Sandhaus | 215/218 |
| 6,166,918 A | * | 12/2000 | Olofsson et al. | 361/800 |
| 6,377,475 B1 | * | 4/2002 | Reis | 361/818 |
| 2003/0089635 A1 | * | 5/2003 | Hisaishi et al. | 206/701 |

* cited by examiner

Primary Examiner—Dean A. Reichard
Assistant Examiner—Carmelo Oliva
(74) Attorney, Agent, or Firm—Terri S. Hughes; Barbara R. Doutre

(57) ABSTRACT

A shield (100) having an outer surface (104) and a plurality of sidewalls (106) is disclosed. The plurality of sidewalls (106) extends from the outer surface (104). At least a portion of the plurality of sidewalls (106) are designed to retain the shield to at least a portion of a substrate (102). Further, at least a portion of the plurality of sidewalls (106) are designed to deflect away from the substrate (102) when pressure is applied to the outer surface (104) in such a manner that the outer surface (104) assumes a concave position (202).

24 Claims, 6 Drawing Sheets

ERGONOMIC SHIELD FOR ASSEMBLY TO AND DISASSEMBLY FROM A SUBSTRATE

FIELD OF THE INVENTION

The present invention relates generally to an ergonomic shield for assembly to and disassembly from a substrate.

BACKGROUND OF THE INVENTION

Shields that are currently used are soldered to the printed circuit board or snapped onto a fence that is soldered to the printed circuit board. The removal of these shields to root cause or fix a failure is difficult. In the first case, the shield has to be de-soldered from the printed circuit board. This can cause other components to reflow or become damaged due to excessive heat exposure. In the second case, the shields have to be pried off with a tool, such as a screwdriver. This can cause harm to the operator or to the components on the printed circuit board if the operator slips the tool while attempting to remove the shield.

Thus, there exists a need for a simple, ergonomic and safe design for assembling and disassembling a shield from a substrate without requiring a tool or having to heat the substrate.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
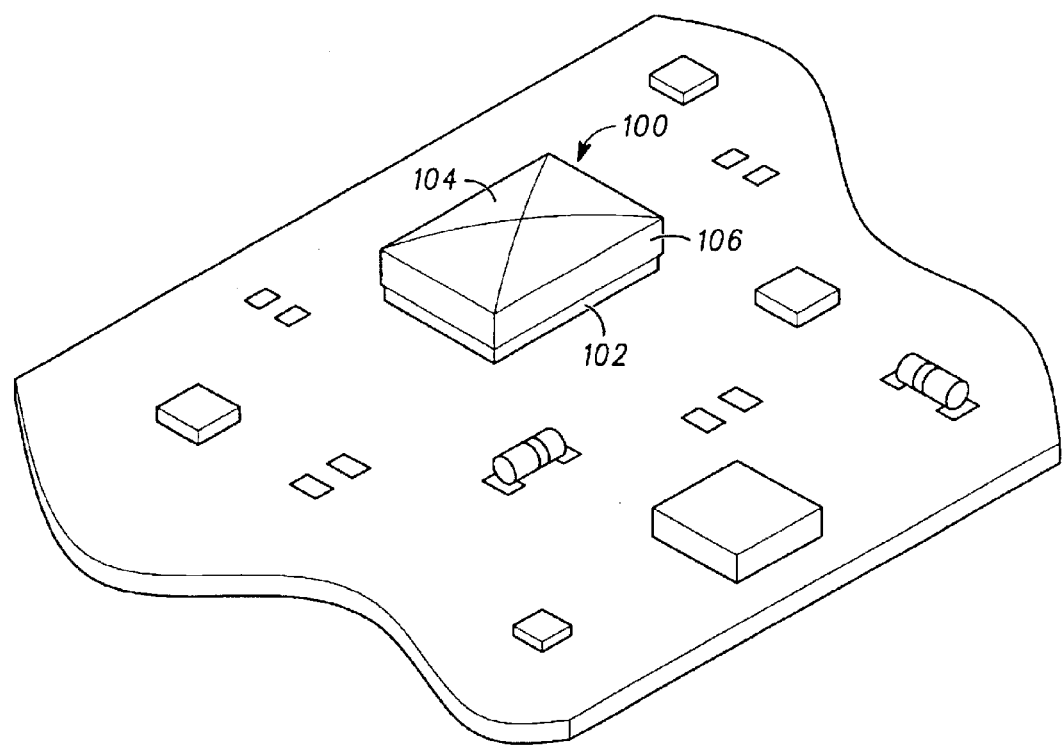
FIG. 1 illustrates a shield attached to a substrate (e.g., printed circuit board) in accordance with the preferred embodiment of the present invention.

While the specification concludes with claims defining the features of the preset invention that are regarded as novel, it is believed that the present invention will be better understood from a consideration of the following description in conjunction with the figures, in which like reference numerals are carried forward.

The present invention provides a simple, ergonomic design for assembling and disassembling a shield from a substrate without requiring a tool or having to heat the substrate. The substrate may be any object/surface to which the shield can attach. Further, the substrate may comprise retention elements (e.g., snaps, dimples, holes, tabs, perforations, and/or the like) around at least a portion of the area to be covered by the shield to assist in the retention of the shield to the substrate.

Referring now to FIG. 1, the shield 100 is retained to a substrate 102 in accordance with the preferred embodiment of the present invention. For purposes of the following examples only, it is assumed that the substrate 102 is a fence soldered to a printed circuit board as typically employed by those skilled in the art. Preferably, the shield 100 is a metallic material, however, it could be made of any suitable material, including plastic or any other non-metallic material. The shield 100 comprises at least an outer surface 104 and a plurality of sidewalls 106. In the preferred embodiment, the plurality of sidewalls 106 extend from the outer surface 104, however, the plurality of sidewalls may be attached or coupled to the outer surface 104 in any suitable fashion. The shield 100 may further comprise retention elements (not shown, e.g., snaps, dimples, holes, tabs, perforations, or the like) that are located within at least a portion of the plurality of sidewalls 106 or that extend from at least a portion of the plurality of sidewalls 106 and attaches to the substrate 102; as stated above, the retention elements (not shown) assist in the retention of the shield 100 to the substrate 102. Although illustrated as substantially rectangular with linear side portions, it should be recognized that the shield 100 could be formed into other geometric shapes, such as square, semi-rectangular, or even circular or semi-circular shapes that include curvilinear side portions.

Figure 2:
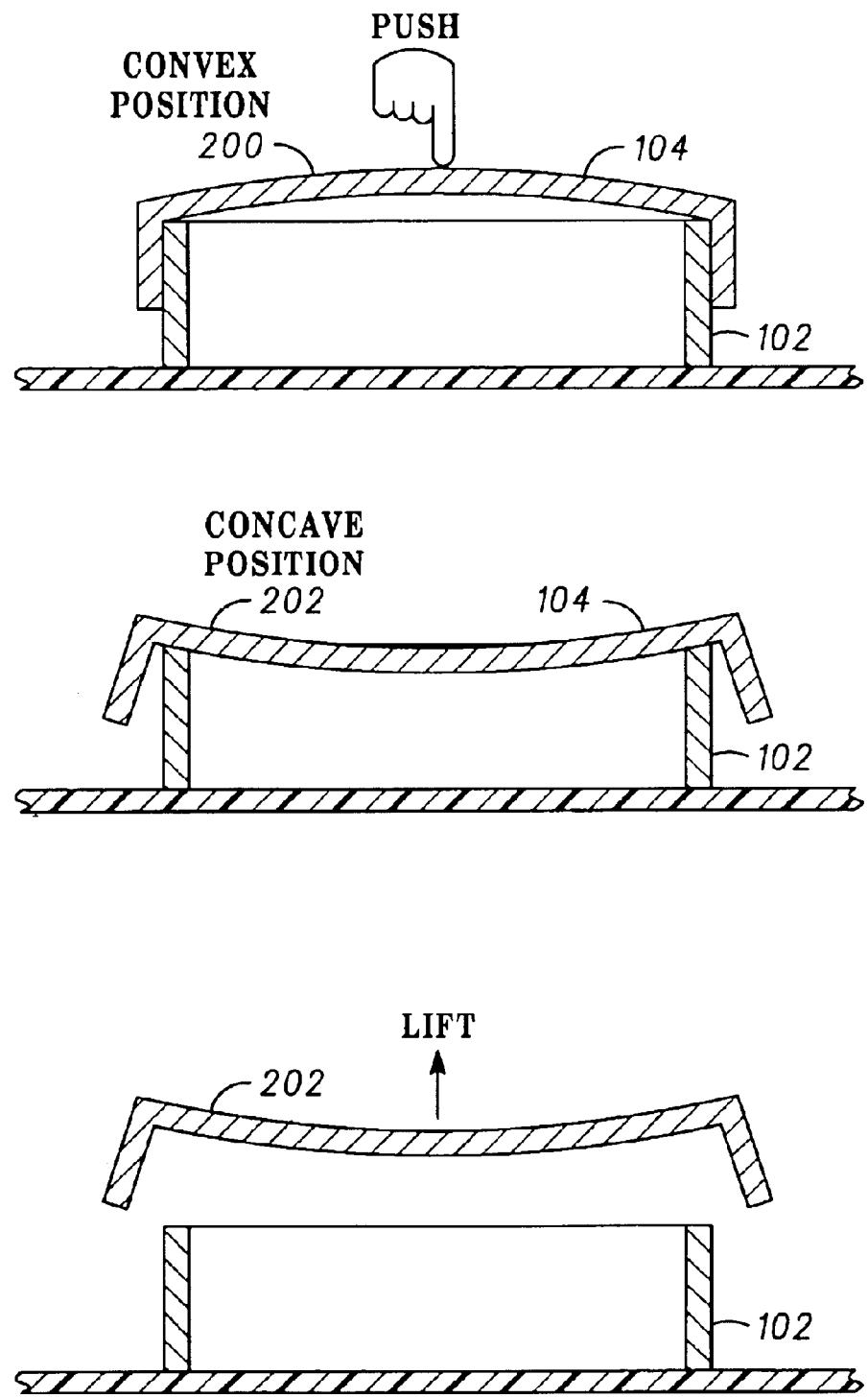
FIG. 2 illustrates cross-sectional views of the shield of FIG. 1 in accordance with the preferred embodiment of the present invention.

In the preferred embodiment, and as described in the following examples, the outer surface 104 of the shield 100 can assume one of two positions as illustrated in FIG. 2: an original position 200 and an inverted position 202. For purposes of the following examples only, the original position 200 is when the outer surface 104 of the shield 100 is at least slightly convex (however, in some embodiments, the original position of the outer surface 104 may be substantially flat, pyramid-like, or configured in some other suitable manner); the inverted position 202 is when the outer surface 104 of the shield 100 is at least slightly concave. It should be noted that in the preferred embodiment of the present invention, the shield 100 may only be removed from the substrate 102 while in the inverted position 202 as shown at the bottom of FIG. 2.

Figure 3:
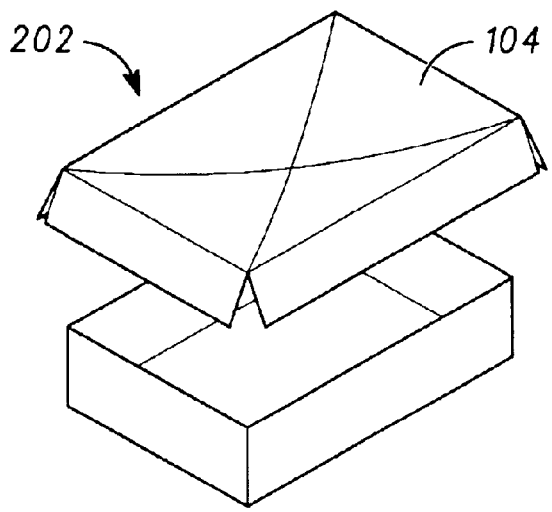
FIG. 3 illustrates a first embodiment for assembling the shield to the substrate in accordance with the preferred embodiment of the present invention.
Figure 3:
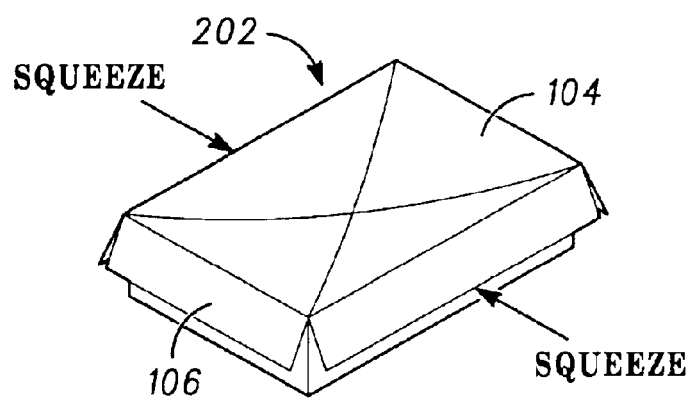
Figure 3:
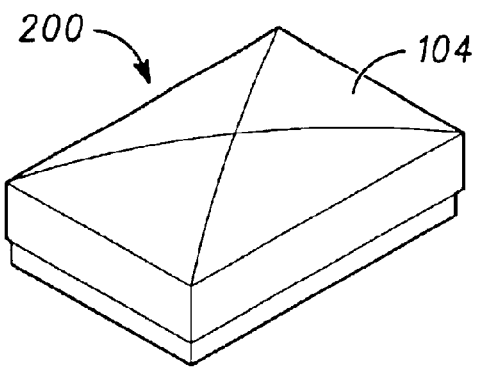

Now that the shield 100 has been generally described, lets turn the discussion to the assembly process of attaching the shield 100 to the substrate 102. FIG. 3 illustrates a first embodiment for assembling the shield 100 to the substrate 102 in accordance with the preferred embodiment of the present invention. In the first embodiment, with the outer surface 104 of the shield 100 in its inverted (concave) position 202, the shield 100 is placed over at least a portion of the substrate 102 in which it will attach. Once the shield 100 is placed over the substrate 102, the operator applies pressure to (i.e., squeezes) at least two of the plurality of sidewalls 106 of the shield 100 into the substrate 102 until the outer surface 104 returns to its original (convex) position 200 and at least a portion of the plurality of sidewalls 106 retains the shield to the substrate 102. In the preferred embodiment, if the shield 100 does not comprise retention elements, at least a portion of the plurality of sidewalls 106 retains the shield 100 to the substrate 102 via friction or other suitable means; if the shield 100 comprises retention elements, the retention elements of the shield 100 will engage/mate with the retention elements of the substrate 102, if any.

Figure 4:
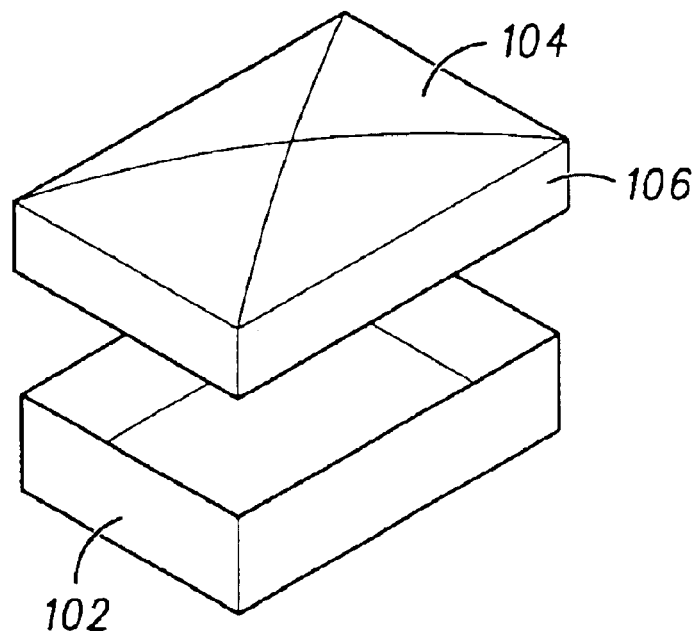
FIG. 4 illustrates a second embodiment for assembling the shield to the substrate in accordance with the preferred embodiment of the present invention.
Figure 4:
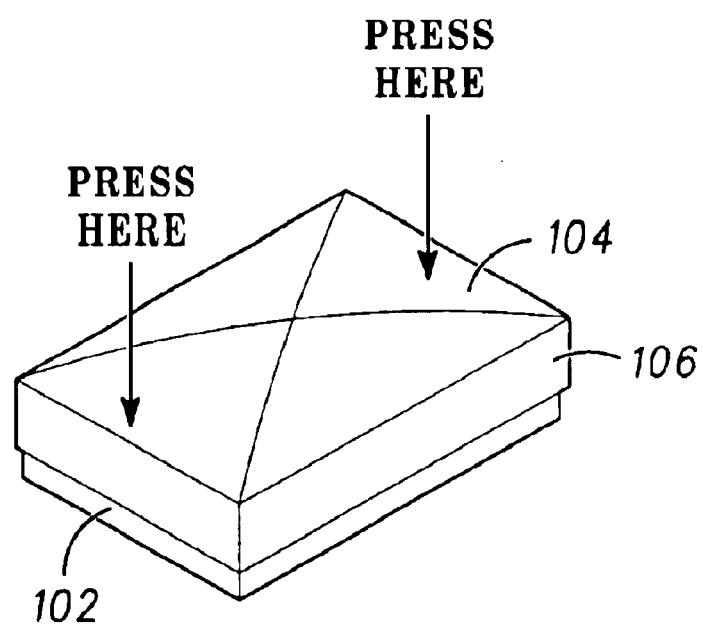

FIG. 4 illustrates a second embodiment for assembling the shield 100 to the substrate 102 in accordance with the preferred embodiment of the present invention. In the second embodiment, with the outer surface 104 in its original (convex) position 200, the operator places the shield 100 over the substrate 102 and presses or slides the shield 100 onto the substrate 102 until at least a portion of the plurality of sidewalls 106 retains the shield 100 to the substrate 102, or until the retention elements of the shield 100 engages/mates with the retention elements of the substrate 102.

Figure 5:
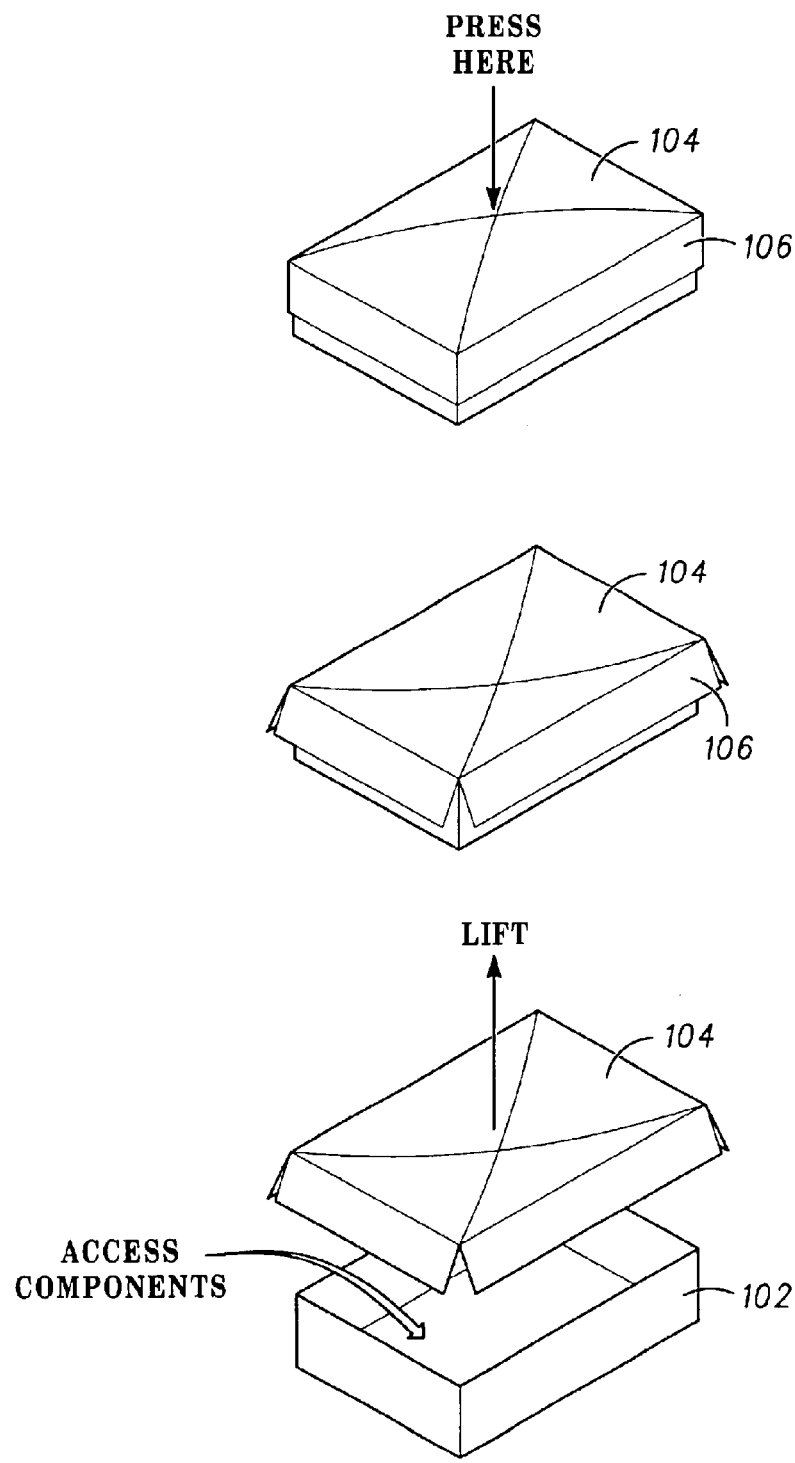
FIG. 5 illustrates an embodiment for disassembling the shield from the substrate in accordance with the preferred embodiment of the present invention.

Now that the shield 100 is attached to the substrate 102, lets turn the discussion to the disassembly process of removing the shield 100 from the substrate 102 in accordance with the preferred embodiment of the present invention. As illustrated in FIG. 5, when the need arises to remove the shield 100 from the substrate 102, the operator presses the outer surface 104 of the shield 100 causing it to invert. In the preferred embodiment, pressure is applied substantially in the center of the outer surface 104, however, pressure may be applied elsewhere and still cause the outer surface 104 to assume the inverted (concave) position 202. As shown in FIG. 2, the outer surface 104 of the shield 100 is formed in such a way that when pressure is applied, it will invert itself from its original (convex) position 200 into its inverted (concave) position 202, thus allowing at least a portion of the plurality of sidewalls 106 to deflect outward (i.e., away from the substrate 102) causing the shield 100 to disengage from the substrate 102. If retention elements are used on the shield 100 and the substrate 102 as described above, when the shield 100 assumes its inverted (concave) position 202 when pressure is applied to the outer surface 104, at least a portion of the plurality of sidewalls 106 and/or the retention elements of the shield 100 deflect outward in order for the sidewalls and/or retention elements of the shield 100 to disengage from the substrate and/or the retention elements of the substrate 102. Once the shield 100 assumes its inverted (concave) position 202, the operator can then simply remove the shield 100 from the substrate 102.

It should be noted that the outer surface 104 of the shield 100 may retain its inverted (concave) position 202 for a predetermined period of time (e.g., like a push button), indefinitely (e.g., for a one-time use), until pressure is applied to at least a portion of the plurality of sidewalls 106 (as described with reference to the first embodiment of the assembly process), until pressure is applied to an inner surface (not shown) of the shield 100, or the like.

Figure 6:
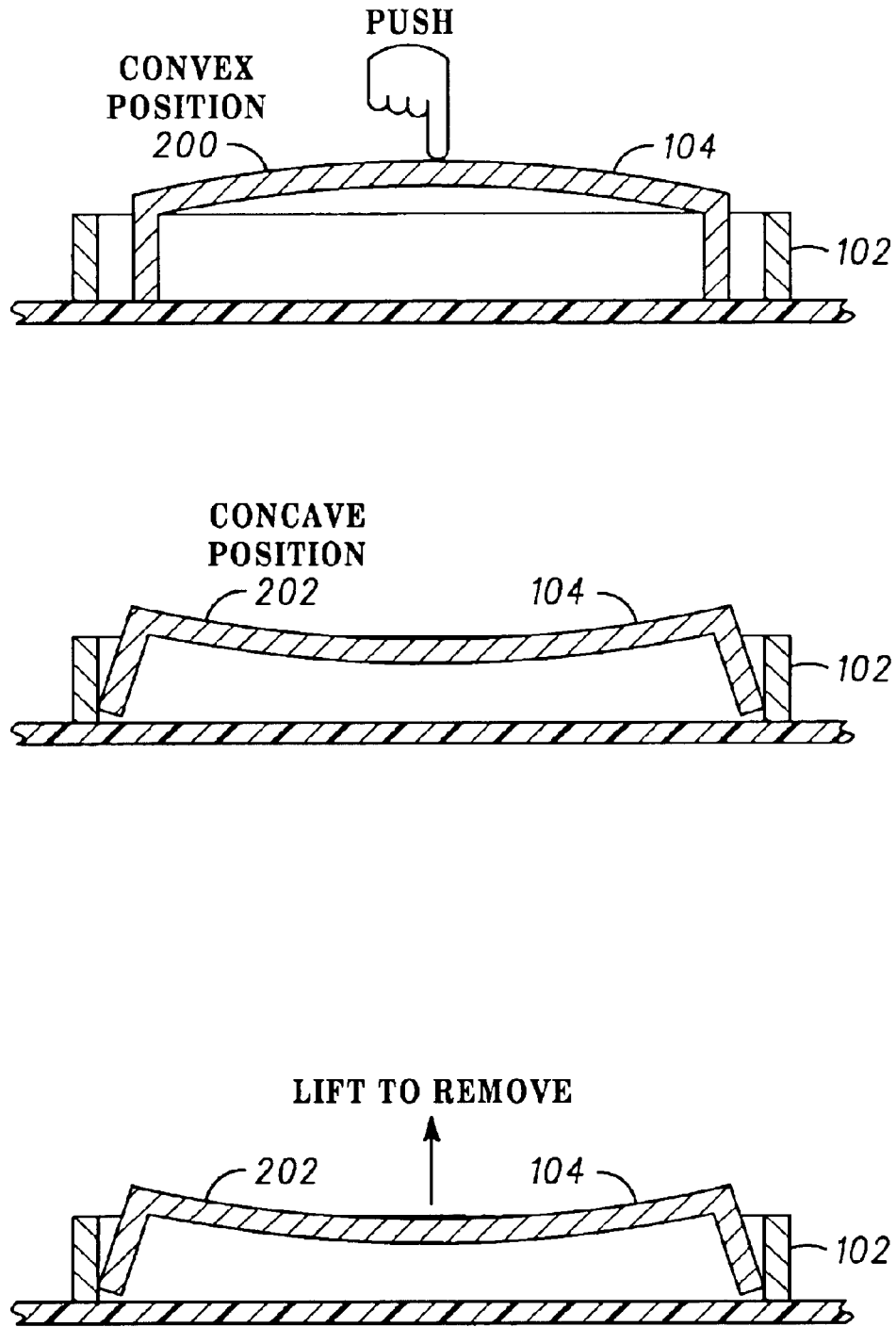
FIG. 6 illustrates cross-sectional views of the shield in accordance with an alternative embodiment of the present invention.

Let us now turn our attention to an alternative embodiment of the present invention as illustrated in FIG. 6. As shown, while in its original (convex) position 200, the shield 100 can be placed within the substrate 102. Once placed, the operator may apply pressure to the outer surface 104 of the shield 100 causing it to assume its inverted (concave) position 202. Once the plurality of sidewalls 106 are deflected outward, the plurality of sidewalls 106 will retain its position against the substrate 102. As a result, the shield 100 is assembled to the substrate 102. As noted above in the preferred embodiment, if the shield 100 does not comprise retention elements, at least a portion of the plurality of sidewalls 106 retains the shield 100 to the substrate 102 via friction or other suitable means; if the shield 100 comprises retention elements, the retention elements of the shield 100 will engage/mate with the retention elements of the substrate 102, if any.

In order to disassemble the shield 100 from the substrate 102 in the alternative embodiment, a tab or other suitable feature (not shown) is placed on the outer surface 104. When the need arises to remove the shield 100 from the substrate 102, the operator pulls the tab away from the substrate 102 that causes the plurality of sidewalls 106 to release from the substrate 102. Preferably, the pulling of the tab causes the outer surface 104 to assume its original (convex) position 200, however, it is not necessary. When the need arises to re-assemble the shield 100 to the substrate 102, the operator may squeeze at least two sidewalls 106 towards each other (as described above), may apply pressure to the inner surface of the shield 100 (as described above), or any other suitable technique that will allow the outer surface 104 of the shield 100 to assume its original (convex) position 200. While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. A shield comprising:
an outer surface; and
a plurality of sidewalls extending from the outer surface, wherein at least a portion of the plurality of sidewalls are designed to retain the shield to at least a portion of a substrate, the substrate being formed of a fence soldered to a printed circuit board, and wherein at least the portion of the plurality of sidewalls are designed to deflect away from at least the portion of the substrate when pressure is applied to the outer surface in such a manner that the outer surface assumes a concave position that allows for lifting the shield to remove it from the substrate.

2. The shield of claim 1 wherein the outer surface retains the concave position for a predetermined time period.

3. The shield of claim 1 wherein the outer surface retains the concave position indefinitely.

4. The shield of claim 1 wherein the outer surface retains the concave position until pressure is applied to at least a portion of the plurality of sidewalls.

5. The shield of claim 1 further comprising an inner surface, and wherein the outer surface retains the concave position until pressure is applied to the inner surface.

6. The shield of claim 1 wherein the outer surface assumes a convex position when at least the portion of the plurality of sidewalls retains the shield to at least the portion of the substrate.

7. The shield of claim 1 wherein the outer surface is substantially flat when at least the portion of the plurality of sidewalls retains the shield to at least the portion of the substrate.

8. The shield of claim 7 wherein pressure is applied to at least two sidewalls by squeezing the at least two sidewalls towards the substrate.

9. The shield of claim 1 wherein at least the portion of the plurality of sidewalls retain the shield to at least the portion of the substrate when pressure is applied to at least two sidewalls in such a manner that the outer surface assumes a convex position.

10. The shield of claim 1 wherein at least the portion of the sidewalls retains the shield to at least a portion of the substrate when pressure is applied to at least a portion of the perimeter of the outer surface.

11. The shield of claim 1 wherein at least the portion of the plurality of sidewalls retains the shield to at least a portion of the substrate via friction.

12. The shield of claim 1 wherein at least the portion of the plurality of sidewalls retains the shield to at least a portion of the substrate via retention elements.

13. The shield of claim 1 further comprising retention elements that extend from at least a portion of the plurality of sidewalls.

14. The shield of claim 1 further comprising retention elements that are embedded within at least a portion of the plurality of sidewalls.

15. The shield of claim 1 wherein the shield is formed into one of the following geometric shapes: substantially rectangular, semi-rectangular, square, substantially circular, and semi-circular.

16. The shield of claim 1 wherein the outer surface of the shield assumes the concave position when downward pressure is applied substantially in the center of the outer surface.

17. A shield comprising:
   an outer surface that assumes one of a convex position and a concave position; and
   a plurality of sidewalls extending from the outer surface, wherein at least a portion of the plurality of sidewalls are designed to retain the shield to at least a portion of a substrate, the substrate being formed of a fence soldered to a printed circuit board, when pressure is applied to at least two sidewalls in such a manner that the outer surface assumes the convex position, and wherein at least a portion of the plurality of sidewalls are further designed to deflect away from at least a portion of the substrate when pressure is applied to the outer surface in such a manner that the outer surface assumes the concave position that allows for lifting the shield to remove it from the substrate.

18. The shield of claim 17 wherein the outer surface of the shield assumes the convex position when the at least two sidewalls are squeezed toward the substrate.

19. The shield of claim 17 wherein the outer surface of the shield assumes the concave position when downward pressure is applied substantially in the center of the outer surface.

20. The shield of claim 17 wherein at least the portion of the plurality of sidewalls are designed to retain the shield to at least a portion of the substrate via friction.

21. The shield of claim 17 wherein at least the portion of the plurality of sidewalls are designed to retain the shield to at least a portion of the substrate via retention elements.

22. A shield comprising:
   an outer surface; and
   a plurality of sidewalls extending from the outer surface, wherein at least a portion of the plurality of sidewalls are designed to deflect toward a substrate, the substrate being formed of a fence soldered to a printed circuit board, and retains the shield to at least a portion of the substrate when pressure is applied to the outer surface in such a manner that the outer surface assumes a concave position that also allows for lifting the shield to remove it from the substrate.

23. The shield of claim 22 wherein at least the portion of the plurality of sidewalls are designed to retain the shield to at least the portion of the substrate via friction.

24. The shield of claim 22 wherein at least the portion of the plurality of sidewalls are designed to retain the shield to at least the portion of the substrate via retention elements.

* * * * *